(12) United States Patent
Shevgoor et al.

(10) Patent No.: US 7,915,893 B2
(45) Date of Patent: Mar. 29, 2011

(54) NMR CRYOMAS PROBE FOR HIGH-FIELD WIDE-BORE MAGNETS

(75) Inventors: Siddarth Shevgoor, Columbia, SC (US); F David Doty, Coumbia, SC (US)

(73) Assignee: Doty Scientific, Inc., Columbia, SC (US)

( * ) Notice: Subject to any disclaimer, the term of this patent is extended or adjusted under 35 U.S.C. 154(b) by 118 days.

(21) Appl. No.: 12/518,946

(22) PCT Filed: Nov. 18, 2007

(86) PCT No.: PCT/US2007/085040
§ 371 (c)(1),
(2), (4) Date: Jun. 12, 2009

(87) PCT Pub. No.: WO2008/070430
PCT Pub. Date: Jun. 12, 2008

(65) Prior Publication Data
US 2010/0026302 A1 Feb. 4, 2010

Related U.S. Application Data

(60) Provisional application No. 60/869,284, filed on Dec. 8, 2006.

(51) Int. Cl.
*G01V 3/00* (2006.01)
(52) U.S. Cl. ........................ 324/318; 324/321
(58) Field of Classification Search .......... 324/300–322; 600/407–445
See application file for complete search history.

(56) References Cited

U.S. PATENT DOCUMENTS

| | | | |
|---|---|---|---|
| 4,654,592 A | 3/1987 | Zens | |
| 4,940,942 A | 7/1990 | Bartuska | |
| 5,325,059 A * | 6/1994 | Doty | 324/321 |
| 5,814,992 A * | 9/1998 | Busse-Grawitz et al. | 324/318 |
| 6,320,384 B1 * | 11/2001 | Doty et al. | 324/321 |
| 6,686,740 B2 | 2/2004 | Tschirky | |
| 6,937,020 B2 | 8/2005 | Munson | |
| 7,341,446 B2 * | 3/2008 | Bush | 431/2 |
| 7,482,810 B2 * | 1/2009 | Yamauchi et al. | 324/321 |
| 2006/0176056 A1 | 8/2006 | Doty | |
| 2007/0169487 A1 * | 7/2007 | Seton et al. | 62/51.1 |
| 2010/0109666 A1 * | 5/2010 | Armbruster et al. | 324/318 |
| 2010/0156414 A1 * | 6/2010 | Sakellariou et al. | 324/309 |

OTHER PUBLICATIONS

International Preliminary Report on Patentability in PCT/US07/85040.
International Search Report in PCT/US07/85040.
International Search Report from PCT/US2007/085040 with a mailing date of Mar. 20, 2008.

* cited by examiner

*Primary Examiner* — Brij B Shrivastav
(74) *Attorney, Agent, or Firm* — Oppedahl Patent Law Firm LLC

(57) ABSTRACT

All critical circuit components, including the sample coils, are located along with the spinner assembly in a region that may be evacuated to high vacuum for thermal insulation and high-voltage operation. A hermetically sealed spinner assembly simultaneously satisfies the requirements of hermeticity, low total emissivity, rf compatibility, spinning performance, magnetic compatibility, and high filling factor by utilizing metal construction except for the central region near the rf sample coils. Hence, it is possible to maintain high vacuum in the region external to the MAS spinner assembly even over a broad range of bearing and drive gas temperatures. A bundle of optical fibers is provided for tachometry for spin rates up to 60 kHz. The use of alumina disc capacitors allows the noise contributions from the most critical capacitors to be reduced to a minor fraction of the total and simplifies high voltage operation.

15 Claims, 3 Drawing Sheets

NMR CRYOMAS PROBE FOR HIGH-FIELD WIDE-BORE MAGNETS

CROSS-REFERENCE TO RELATED APPLICATIONS

This patent application claims priority from U.S. patent application No. 60/869,284 filed Dec. 8, 2006, which application is hereby incorporated herein by reference for all purposes.

FIELD OF THE INVENTION

The field of this invention is a probe for Nuclear Magnetic Resonance (NMR) Magic Angle Spinning (MAS) with cryogenically cooled sample coils and other critical circuit components while the sample is near room temperature.

BACKGROUND OF THE INVENTION

Because of the richness of the information available from NMR, it has often been argued that NMR is the most powerful analytical technique for molecular structure determination. However, NMR has been more successful with liquids or materials dissolved in solvents than with rigid solids. The basic problem in NMR of solids is that rapid molecular tumbling and diffusion are not naturally present to average out chemical shift anisotropy and dipolar couplings of abundant spin nuclides. Hence, the lines are normally broad and unresolved (often hundreds of ppm in width). A large number of techniques have been developed to improve the resolution in NMR of solids, but most modern techniques include extremely rapid spinning of the sample at the "Magic Angle" (the zero of the second Legendre polynomial, 54.7°) with respect to $B_0$. If the rotational rate is fast compared to chemical shift anisotropies and dipolar couplings (in units of Hz), the resolution is dramatically improved—often by two or three orders of magnitude. Even when the spinning is not fast enough to satisfy the above conditions, substantial improvements in resolution are generally obtained from the combination of MAS and multiple-pulse methods. Similar resolution problems are encountered in liquids of inhomogeneous systems, as in tissues and the mixtures of liquids and solids, because of susceptibility variations throughout the material. Here, relatively slow MAS is often effective in improving the spectral resolution of the liquid species by several orders of magnitude.

In U.S. Pat. No. 4,511,841, Bartuska discloses a modified Beams-type Bernoulli out-flow drive for MAS; and in his later U.S. Pat. No. 4,940,942, he discloses a method of improving its axial stability and providing variable temperature operation for the sample. In U.S. Pat. No. 5,508,615, I disclose a method of suppressing whirl instability in the radial bearings at very high surface speeds in MAS and improving the stability of balanced axial hydrostatic bearings, similar to the one used in U.S. Pat. No. 5,202,633. In PCT IB2005/05338, U.S. Pat. No. 7,170,292, we disclose a novel Bernoulli inflow axial bearing that is particularly advantageous for MAS when a ceramic dewar is required between the rotor and the sample coils or when the spinner needs to be hermetically sealed for operation inside an external region evacuated to high vacuum.

The progress in increasing sensitivity in NMR has been impressive over the past five decades—three to five orders of magnitude, depending on the application. The most significant, generally applicable contribution to increasing the signal to noise ratio, S/N or SNR, in the past decade has been the introduction of cryoprobes for homogeneous liquid samples, such as that by Marek, U.S. Pat. No. 6,677,751 B1, in which the receiver coil, critical tuning elements, and preamps are cryogenically cooled while the sample is kept at some experimentally desired temperature, usually near room temperature (RT). Using high-purity aluminum coils and single-layer capacitors near 25 K with the preamps perhaps at 80 K, the S/N may be increased on one or more channels in a multi-resonant probe for liquid samples by typically a factor of three to four.

Most modern NMR applications are directed at structure determinations of complex macromolecules, where it is often desirable to utilize a probe with high S/N at two or three different frequencies simultaneously, most often $^1H/^{13}C/^{15}N$, and perhaps additionally be able lock the field on the $^2H$ resonance. High-resolution (HR) NMR probes, in which the sample tube is aligned with the polarizing field, $B_0$, with the sample coil and other circuit elements at cryogenic temperatures, are widely used for improved S/N for liquid samples. In these probes, the sample coils are in an evacuated region for heat insulation reasons; but probes for liquids NMR do not include a sample spinner, and their rf sample coil voltages need not be very high. We are aware of no evidence that NMR probes for solid samples have ever utilized rf coils in vacuum.

Using the same coil (or coils) for both transmit and receive has been the preferred approach in NMR spectroscopy probes, both for liquids and solids, for at least three decades. In this case, Hoult's principle of reciprocity, which at least in its popular usage states that the NMR S/N during reception is, among other things, proportional to the square root of the circuit efficiency for generating a transverse rf magnetic field within the sample during transmit, has seldom been challenged.

Reciprocity, as defined above, fails to be valid when the various loss mechanisms (sample, sample coil, capacitors, shields, etc.) are at significantly different temperatures, as the transmit efficiencies are determined by the various resistances in the circuit, but the noise power during receive is proportional to both the resistance and its temperature. Hence, reciprocity fails in cryoprobes, such as that disclosed in U.S. Pat. No. 5,508,613, where the sample and perhaps some other minor loss components are much warmer than the sample coil. In U.S. Pat. No. 7,151,374, I disclose another case in which reciprocity fails—when the sample coil is not cooled, but other critical circuit components are—that is practical in high field narrow bore magnets.

In patent application publication U.S. Pat. No. 7,282,919, we disclose the first CryoMAS probe for use in wide-bore magnets, where the RT shim bore is typically 73 mm, that permits substantial improvements in S/N in triple-resonance HR MAS NMR in high field magnets without cooling the sample. This referenced prior art has a number of deficiencies: (1) the foam and fibrous materials required for thermal insulation lead to unacceptable outgassing and rapid degradation of the hi-Q hi-voltage rf components from cryodeposits; (2) the rf circuitry voltages are limited by corona and arcing (in the pressurized helium cold zone) to about 1500 V, which is not sufficient for the rf field strengths needed for many applications in NMR of solids; (3) an exceptionally large cryocooler, requiring ~10 kW of mains power, is required to achieve the temperature needed (~25 K) for the desired high gain in S/N and high stability of the Q; (4) the electret enhanced tribo-electric spin rate detection has very poor sensitivity when used with zirconia ceramic and the instability of the signal makes automatic closed loop control of the spin rate extremely difficult to achieve; (5) very high thermal strain is unavoidable in the ceramic spinner dewar, which makes it difficult to achieve reliability of its vacuum seals; and (6) the large first-stage heat leaks require an inconveniently large first-stage (90 K) cooling loop and a complex defrost system.

This instant disclosure provides effective solutions to the above problems in the prior art and simultaneously reduces overall manufacturing complexity and cost. The inventive design is readily compatible with triple-resonance plus lock, extended-range variable temperature operation, automatic sample exchange, and commonly available closed-cycle cold fingers.

The key to the innovation is the discovery that it is possible to make a ceramic/metallic spinner assembly that simultaneously satisfies the requirements of hermeticity, low total emissivity, rf compatibility, spinning performance, magnetic compatibility, and high filling factor by utilizing metal construction except for the central region near the rf sample coils. Hence, it is possible to maintain high vacuum in the region external to the novel MAS spinner assembly even over a very broad range of bearing and drive gas temperatures.

The instant invention, like the prior art CryoMAS, utilizes multiple rf sample coils to allow more effective minimization of sample losses, as discussed in "Using a cross-coil to reduce RF heating by an order of magnitude in triple-resonance multinuclear MAS at high fields", *J. Magn. Reson.*, 2006, 182, 239-253, by F. D. Doty, J. Kulkarni, C. Turner, G. Entzminger, and A. Bielecki. This is essential for minimization of sample noise and hence for maximum S/N.

The benefits of operating high-voltage components in high vacuum, are well known. While the breakdown voltage decreases by more than two orders of magnitude as the gas pressure is reduced from standard atmospheric pressure to about 1 Torr for gaps of ~6 mm at zero magnetic field, as the pressure is further reduced, the breakdown voltage increases. At zero field, the breakdown at pressures below ~20 mTorr may be an order of magnitude greater than at one atmosphere. The breakdown voltage in low pressure helium at high magnetic fields can be two orders of magnitude lower than for nitrogen at similar pressure and zero magnetic field. While pressure below 50 mTorr may be sufficient for some applications, successful operation of high-voltage rf circuits in a vacuum in high magnetic field where the primary residual gas is helium often requires pressure below 2 mTorr. Achieving this level of vacuum in a complex rf zone that houses an MAS sample spinner (especially one that must operate over a wide range of temperatures) and must be pumped via a flexible evacuation hose at least 5 m long has previously been perceived to be impractical.

We have discovered that seals between soft copper alloys of acceptably low magnetism (<5E-5 volumetric SI units) and some ceramics, including zirconia and silicon nitride, made using high-strain, high-strength epoxy between overlapping thin-walled cylinders of minimal clearance can achieve sufficient hermeticity (helium leak rates below 1E-7 std-cc/s) and mechanical robustness over the temperature range of at least 80-400 K, as desired for the NMR sample temperature range. When the metallic cylinder is outside the ceramic cylinder in the joint, both the epoxy and the ceramic in the lap joint experience primarily compressive stresses at temperatures below the temperature at which the epoxy was cured. Brittle materials are much less likely to fail under compressive stress than under tensile stress. Helium leak rates smaller than 1E-7 std-cc/s could further enhance performance and reliability, and leak rates as large as 1E-4 std-cc/s could sometimes be acceptable.

The benefits of operating cryogenic components in high vacuum to minimize convective heat loss are also well known, but elimination of convective heat loss is not sufficient for acceptably low heat load. The emissivity of warm ceramics, as required in the central portion of the hermetic MAS spinner assembly, is typically greater than 0.8. This would lead to an unacceptable heat load on the second-stage (~25 K) cold finger if the ceramic surface area was not quite small. A novel spinner design allows hermetic sealing between metallic manifold components and the central ceramic components of minimal surface area. The ceramic and plastic spinner assembly and sleeve components in the prior art CryoMAS spinner assembly had external surface area greater than 30 $cm^2$, while the novel hermetic spinner design typically has non-metallic external surface area less than 15 $cm^2$.

Various structural and ducting components within the vacuum zone may be warm (200-400 K) without leading to excessive thermal background radiation (and cooling costs) if their surfaces have emissivity below 0.05. Moreover, their contribution to circuit noise may be acceptably small if care is taken to minimize rf eddy currents induced in them and if their surfaces have high electrical conductivity, such as gold flash (~0.2 microns) over silver plate.

For maximum S/N benefit, it is necessary to utilize ultra-high-Q capacitors that handle high voltages (greater than 2 kV, preferably 4 kV) and tolerate repeated thermal cycling. In addition, for effective conductive cooling of the sample coil, it is necessary to utilize a dielectric of high thermal conductivity. The coaxial sapphire capacitors disclosed in the prior art CryoMAS patent and publications suffer from extremely high E-field concentrations at the ends of the outer copper sleeve, which makes it difficult to exceed 1500 V breakdown. Disc capacitors are found to have much lower E-field concentrations at the edges of the electrodes for similar dielectric thickness and voltage. The standard low-loss ceramic capacitor dielectrics have thermal conductivity in the range of 1.5 to 8 W/m-K at temperatures in the range of 20 to 40 K. We find no evidence to suggest that high-voltage disc capacitors made using a dielectric of high thermal conductivity (such as alumina, beryllia, magnesia, silicon nitride, aluminum nitride, or single-crystal quartz, all of which have thermal conductivity greater than 15 W/m-K at temperatures between 20 and 40 K) have ever been used in an NMR probe. We also find no evidence that copper-electrode ceramic disc capacitors have ever been used in NMR probes. High-grade alumina (>95%) is a particularly advantageous dielectric, as it has extremely low RF dielectric loss, exceptionally high thermal conductivity in the 20-40 K range, is mechanically robust, is not toxic, and may be copper plated by proven methods.

Cryodeposits (of solid water, nitrogen, oxygen, argon, $CO_2$, etc.) build-up over time on cold surfaces that are not in nearly perfect vacuum. The cryodeposits severely degrade the high-voltage dielectric properties of low-loss dielectrics, and they greatly increase the emissivity of bright metals. The problem is more severe when the cold zone contains warm surfaces, especially of softer materials, that have not been carefully outgased at elevated temperature. The need for plastics and foamed and fibrous materials in the prior art pressurized CryoMAS exacerbated the rate of buildup of cryodeposits. Sufficient thermal insulation in the instant invention is obtained using radiation shields, cooled by a first-stage cooler to an intermediate temperature, between the warm components and the cold components. With a radiation shield, the external boundaries of the vacuum zone that contains the cold electronics and the hermetically sealed spinner assembly may be at RT. The outgassing and cryodeposits may be minimized if the vacuum zone is made compatible with a vacuum bake-out at an elevated temperature.

SUMMARY OF THE INVENTION

An improved CryoMAS probe is disclosed for obtaining a substantial improvement in signal to noise ratio (S/N) in high-resolution (HR) magic-angle-spinning (MAS) NMR of samples near room temperature (RT) in high-field magnets where the magnet's RT shim bore is greater than 60 mm. All critical circuit components, including the sample coils, are located along with the spinner assembly in a region that may be evacuated to high vacuum for thermal insulation and high-voltage operation. The MAS probe is also compatible with triple resonance, auto sample exchange, variable temperature operation, field locking, and commonly available closed-cycle cold fingers.

One major challenge in implementing CryoMAS is solving the problem of gas leakage from the spinner bearing, drive, and exhaust nitrogen into the cold zone, as some spinner components will necessarily be ceramic and some metal. A novel, hermetically sealed spinner assembly is disclosed which simultaneously satisfies the requirements of hermeticity, low total emissivity, rf compatibility, spinning performance, magnetic compatibility, and high filling factor by utilizing metal construction except for the central region near the rf sample coils. Hence, it is possible to maintain high vacuum in the region external to the novel MAS spinner assembly even over a broad range of bearing and drive gas temperatures. A bundle of optical fibers is provided for tachometry for spin rates up to 60 kHz. The use of alumina disc capacitors allows the noise contributions from the most critical capacitors to be reduced to a minor fraction of the total and simplifies high voltage operation.

DETAILED DESCRIPTION OF THE PREFERRED EMBODIMENT

Figure 1:
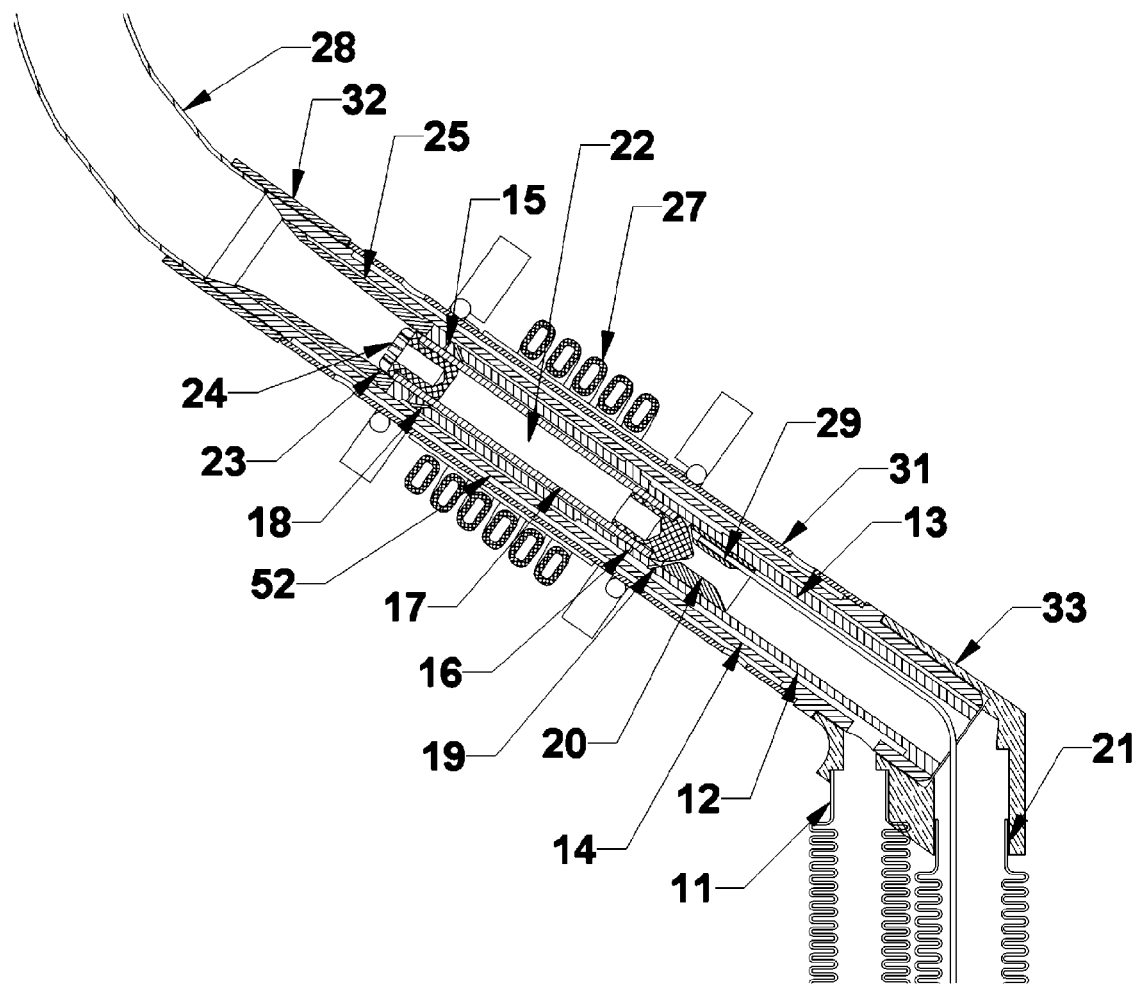
FIG. 1 is a cross-section the CryoMAS spinner assembly in the XZ plane.

FIG. 1 depicts a view in the XZ plane, roughly to scale, of a representative spinner assembly suitable for the improved CryoMAS probe. Warm bearing gas may be supplied through a small metallic tube 11 at just the rear end and ducted internally in a channel 12 between the innermost sleeve, identified as the spinner stator 13, and the stator housing tube 14 to the bearing orifices 15, 16 near both ends of the ceramic rotor 17, to the variable sample temperature (VT) control jets 18, and to the inflow Bernoulli bearing orifices 19 that form the axial bearing over the conical stator insert 20, at the lower end of the rotor. The bearing gas temperature may be well below or well above room temperature, heated and sensed according to the prior art. Exhaust from the axial bearing and the lower bearing orifices 16 vents axially and then downward through a metallic bearing exhaust tube 21.

The ceramic rotor 17 containing the warm sample 22 is driven by warm gas from drive nozzles 23 engaging a radial-inflow microturbine 24 attached to the upper end of the rotor 17. The drive manifold groove 25 in the spinner stator 13 is pressurized with gas via another small metallic tube 26 not visible in this view, as it is off to the side so as to keep the region below the front of the spinner assembly free for the high-power reactive circuit elements needed to double tune the outer sample solenoid 27 for the LF and MF frequencies. The drive gas vents up the curved rotor-loading tube 28, through which the warm rotor may be pneumatically ejected and a new one dropped into place. The spin-rate is sensed by means of an optical fiber bundle, 29, placed such that the lower end of the rotor 17, is in direct view of the bundle and is partially coated with a reflective or different colored material. The bundle 29, is routed through the bearing exhaust tube 21 and secured to the conical stator insert, 20. The inner foil high-frequency (HF) cross coil 30, between the ceramic coil-form 31 and the sample solenoid 27 is also not visible in this view, as it is very thin, typically about 0.05 mm thick, and may not have any features in the XZ plane, according to the prior art. The plurality of small capacitors at each end used to tune the cross coil to the $^1$H frequency, according to the prior art in U.S. Pat. No. 6,130,537, are also not fully visible in this view, as they are not in the XZ plane.

The inflow-Bernoulli axial bearing and other important spinner assembly details, especially related to the rotor tip plug and the Doty bearing, are disclosed in more detail in U.S. Pat. No. 7,170,292. Other types of Bernoulli axial bearings, such as those in U.S. Pat. No. 4,446,430 or in U.S. Pat. No. 4,940,942, could also be used, though with some disadvantages. It is necessary to achieve stable sample spinning, at least between 2 kHz and 8 kHz, over the sample temperature range of at least 250 K to 350 K. More preferably, spinning rates from 300 Hz to 30 kHz and sample temperatures from 90 K to 400 K are desired while the sample solenoid is kept below 30 K. In most cases, nitrogen would be used for the bearing and drive gases, but in some cases, it may be desirable to use helium to permit sample spinning at lower temperatures, possibly down to 20 K, or at higher speeds. The spinning gas normally would exhaust from the probe, through tubes 21 and 28, at near atmospheric pressure, but these pressures may be significantly different from atmospheric pressure, possibly from 0.05 MPa to 0.2 MPa, if needed to improve spinning or sample exchange performance.

The ends of the stator housing tube may be joined to thin walled metallic manifold rings 32, 33 using high-strain, high-strength epoxies to form hermetic seals that result in helium leak rates less than 1E-7 std-atm-cc/sec. Suitable tapers and fillets may be provided in the metal rings and ceramic tube to minimize stress concentrations.

Figure 2:
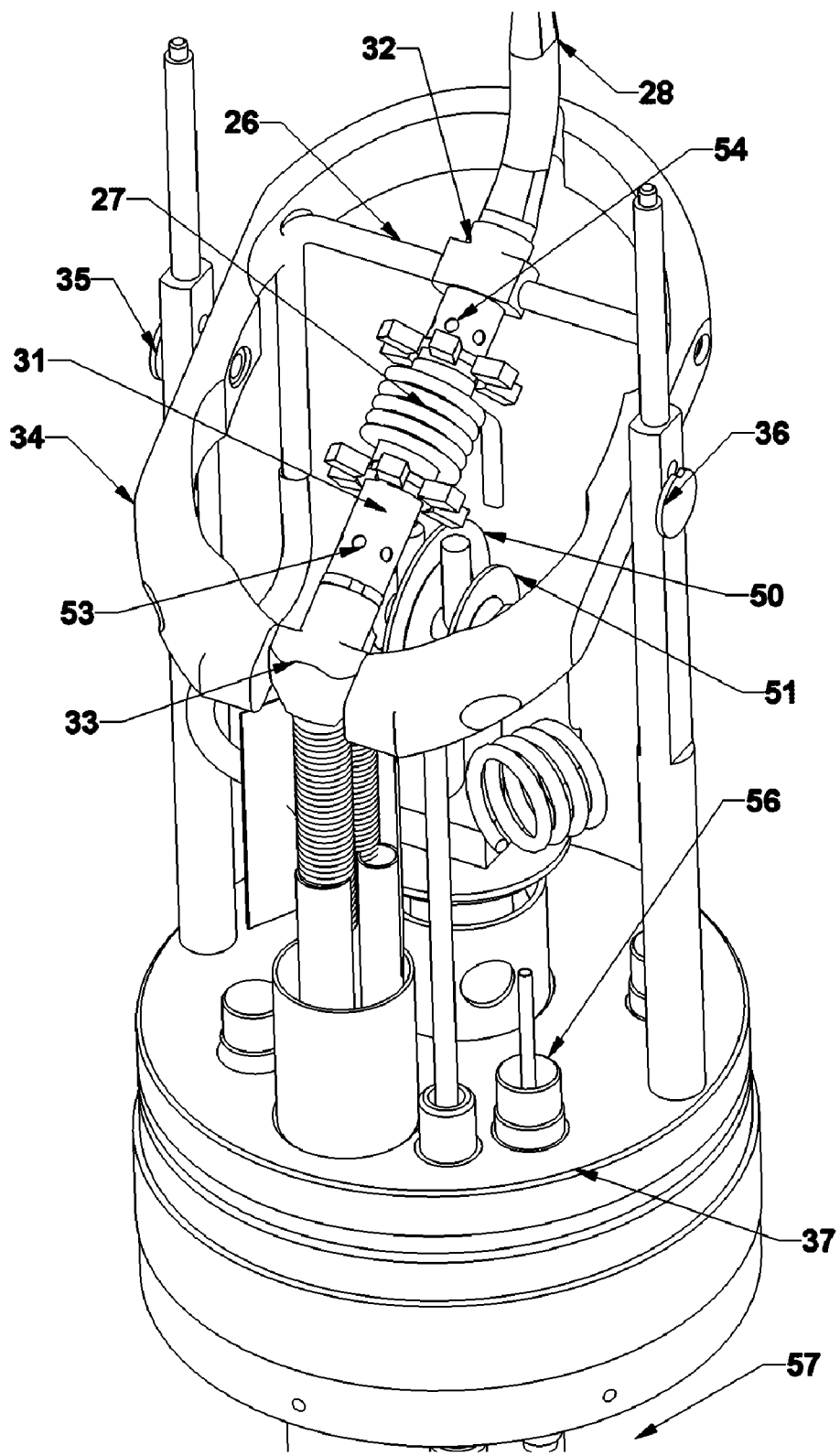
FIG. 2 is a perspective view showing several components of the probe.

FIG. 2 shows a side overview of the upper portion of the cylindrical CryoMAS probe, also referred to herein as the probe-head, for use in a wide-bore high-field NMR magnet, including the spinner assembly as was shown in more detail in FIG. 1. Note that the magnet's field strength would usually be greater than 7 T and at least greater than 4 T, as improvements in S/N in low-field applications could more easily be obtained by simply increasing the rotor size. The spinner assembly described above is held by a support ring 34 over suitable bearings at the pivot pins 35, 36 such that minor adjustments may be possible to its orientation with respect to the axis of the magnet bore. The metallic tubes 11, 21, 26, 28 through which the spinning gases flow, may be made of flexible metal tubes, such as bellows, for a short length to permit such minor adjustments to the orientation. A metallic RT-gas barrier plate, 37, that serves as a structural base for the components of the probe-head is rigidly attached to remainder of the probe structure not shown in the figure.

Figure 3:
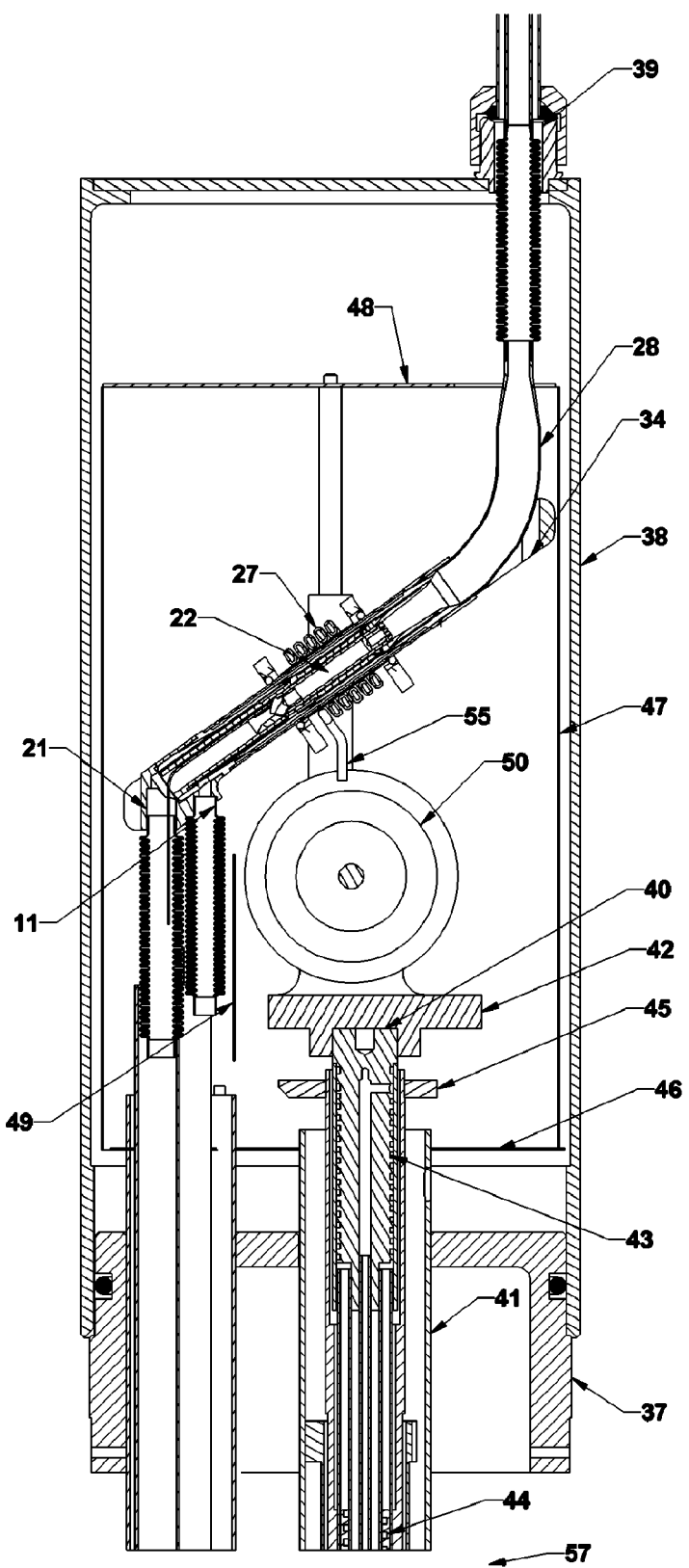
FIG. 3 is a longitudinal view of the CryoMAS probe layout in the XZ plane.

FIG. 3 shows a cross section of the upper portion of the probe in the XZ plane. A low-magnetism vacuum jacket 38 surrounds the cold zone and is sealed using an o-ring at the RT gas-barrier plate 37 to which it is firmly secured. The vacuum jacket 38 also includes a sealed access duct 39 in the top, suitably designed for sufficiently low gas leak, through which the rotor-loading duct 28 may pass and be sealed by means of an o-ring. The wall of the vacuum jacket 38 is plated on the inside with silver, gold, or copper to a thickness of several rf skin depths at the operating temperature and is made predominately of a low magnetism alloy.

The helium-gas-cooled cold finger 40 slides into the cold-finger support tube 41 and is attached to the second-stage cold plate, 42, typically of copper alloy with silver or gold plate. A heat exchanger, 43, made of high conductivity copper, referred to herein as the second-stage heat exchanger, is provided at the upper end of the cold finger as a means of effective heat exchange between the cold plate 42 and the cold helium gas stream. With sufficient attention to the cryo-engineering details, the heat leak can be made sufficiently small for compatibility with commonly available small, closed-cycle, gas-cooled, cold fingers that provide 3.5 W cooling at 25 K, for example, or perhaps larger cold fingers providing more cooling power or lower temperatures. A second helium-gas-cooled heat exchanger, 44, located downstream of the aforementioned second-stage heat exchanger, 43, recovers additional cooling power from the cold helium gas and is connected to a first-stage cool plate, 45, which operates a temperature greater than that of the second stage cold plate 42. As in prior art, several metal and plastic tubes separated by vacuum may be used to confine and insulate the cold helium gas flowing within the cold finger. The instant invention may also use the space between the cold finger 40 and support tube 41 to evacuate the region surrounding the spinner assembly shown in FIG. 1 into a manifold at the base of the probe, not shown in the figures as it has no novel features, which is pumped to a pressure less than 50 mTorr by conventional vacuum pumping means via a flexible conduit that may be over 5 m long. Alternatively, a separate metal tube may be used to evacuate the aforementioned space surrounding the spinner assembly into the manifold at the base. Thermal radiation shields 46, 47, 48, 49, made of thin sheet metal, the surface emissivity of which may be generally less than 0.05 but must be less than 0.1, are placed surrounding the cold components and such shields are cooled conductively to temperatures below 150 K via metal strips by the first-stage cold plate 45. The warm structural components not fully separated from the cold parts by thermal radiation shields such as the metal tubes 11, 20, must have their surfaces polished to a high degree and plated such that their emissivity is less than 0.2.

The solenoid is conduction cooled to typically 27 K via thermally conductive alumina-dielectric disc capacitors, 50, 51, from each end to the cold ground plate 42. The ceramic coil-form, 31, is supported at the ends by the warm housing tube 14, from which the coil-form must be substantially thermally isolated to reduce heat transfer. Such isolation may be achieved by (a) making physical contact between the coil-form 31 and housing tube 14 only over a short length at each of the ends and allowing a cylindrical space 52 between the two parts over a major portion of the length of the coil-form; (b) minimizing the area of ceramic parts that have surface emissivity greater than 0.5 to reduce radiative heat exchange; (c) reducing the cross section area available for thermal conduction by including a set of holes 53, 54 at or near the ends of the coil-form; (d) evacuating the cylindrical space 52 between the coil-form and housing tube 14 via the sets of holes 53, 54 to reduce convective heat exchange. Note that the external surface area of the warm ceramic stator tube 14 is typically under 15 $cm^2$ and there are no other warm components on the spinner assembly having high emissivity except the very ends of the ceramic coil form 31. Total non-metallic external surface area of the spinner assembly is under 20 $cm^2$.

The high voltage passive reactive elements required for tuning are mounted above the cold plate 42, as shown in the perspective view of some of the components in FIG. 2. These include at least one alumina-dielectric disc capacitor 50 providing thermal contact from the cold plate 42 to one lead 55 of the sample solenoid 27, and normally a second alumina capacitor is used at the second solenoid lead. Additional cold capacitors and inductors in the cold zone would also be used as needed to achieve the desired tuning, channel isolation, and impedance transformations from the sample coil to the hermetic rf-feed-through elements 56 which lead to the RT tuning zone 57 below the barrier 37.

In some cases it may be desirable to add a $^2$H lock channel to triple resonance capability. This may be best accommodated by adding a second cross coil between the inner $^1$H cross coil and the outer solenoid 27, according to the prior art. In this case, the $^1$H cross-coil is normally oriented with its $B_1$ nearly transverse to $B_0$ and made with optimal surface coverage for high magnetic filling factor and Q, while the $^2$H cross-coil, typically a 2-turn saddle coil similar to the prior art shown in U.S. Pat. No. 4,641,098, is oriented orthogonally and made with low surface coverage for minimal degradation in the performance of the $^1$H cross coil and outer solenoid.

It is also possible to effectively utilize a single solenoid 27 without an inner cross coil for double-resonance applications at least up to 7 T and possibly at 9.4 T even when the HF channel is for $^1$H, using circuits similar to those used for more than three decades in solids NMR.

Although this invention has been described herein with reference to specific embodiments, it will be recognized that changes and modifications may be made without departing from the spirit of the present invention. All such modifications and changes are intended to be included within the scope of the following claims.

RELEVANT ART

1. F. David Doty, "Probe Design and Construction," *Encycl. of NMR*, Vol. 6, Wiley, 1996.
2. F. D. Doty, Y. A. Yang, and G. E. Entzminger, "Magnetism in NMR Probe Design Part II: HR MAS," *Concepts in Magn. Resn.*, Vol 10(4), 239-260, 1998.
3. Ago Samoson, "New Horizons for Magic-Angle Spinning NMR", Topics in Current Chemistry, 246:15-31, 2005, http://www.kbfi.ee/Chem_phys/Homes/Pdf/NewHorizonsMAS_2005.pdf.
4. F. D. Doty, J. Kulkarni, C. Turner, G. Entzminger, A. Bielecki, "Using a cross-coil to reduce RF heating by an order of magnitude in triple-resonance multinuclear MAS at high fields", *J. Magn. Reson.*, 2006, 182, 239-253. http://www.dotynmr.com/PDF/2006_JMR_Doty_Mas_1H_X-C_Coils_preprint.pdf
5. F. D. Doty, S. Shevgoor, J. B. Spitzmesser, "Progress on a 4-channel 3 mm CryoMAS Probe with Auto Sample Exchange for High-field Solids NMR", Presented at EuroMAR, York, UK, 2006.
6. H. Kovacs, D. Moskau, M. Spraul, "Cryogenically cooled probes—a leap in NMR technology", *Mag. Reson. Spect.*, 46,131-255, 2005. http://www.dq.fct.unl.pt/cadeiras/aeii/download/Seminarios/RMN/ProgNMRspectr05_131_CooledProbes.pdf
7. Malcolm Levitt, http://www.cryomasnmr.soton.ac.uk/, 2006.

| U.S. Pat. DOCUMENTS | | | |
|---|---|---|---|
| 4,442,404 | April 1984 | Bergmann | 324/309 |
| 4,940,942 | July 1990 | Bartuska and Lewis | 324/321 |
| 5,508,613 | April 1996 | Kotsubo et al | 324/318 |
| 5,585,723 | December 1996 | Marek et al | 324/318 |
| 5,424,645 | June 1995 | Doty | 324/321 |
| 5,814,992 | September 1998 | Busse-Grawitz et al | 324/318 |
| 5,872,452 | February 1999 | Cory | 324/321 |
| 5,889,456 | March 1999 | Triebe et al | 335/300 |
| 6,130,537 | October 2000 | Doty | 324/321 |
| 6,320,384 B1 | November 2001 | Doty | 324/321 |
| 6,411,092 B1 | June 2002 | Anderson | 324/319 |
| 6,437,570 B2 | August 2002 | Marek | 324/321 |
| 6,617,851 | September 2003 | Bergmann | 324/318 |
| 6,677,751 B1 | January 2004 | Marek et al | 324/318 |
| 7,151,374 B2 | December 2006 | Doty | 324/321 |
| 7,170,292 B2 | January 2007 | Doty et al | 324/321 |
| 7,196,521 B2 | March 2007 | Doty | 324/321 |
| 7,282,919 B2 | October 2007 | Doty et al | 324/321 |

We claim:

1. An NMR MAS probe for NMR investigations of a sample inside a rotor near room temperature in a magnet having static field $B_o$ greater than 4T, said probe comprising
a hermetically sealed spinner assembly comprising concentric thin-walled ceramic stator tubes that are supplied with gas through hermetically sealed metallic bearing and drive gas lines and exhausted through a first hermetically sealed curved, rotor-loading exhaust tube at the upper end and a second hermetically sealed exhaust tube at the lower end,
a vacuum zone external to said spinner assembly,
a duct suitable for evacuation of said vacuum zone to a pressure less than 50 mTorr by external pumping means,
a thin-walled ceramic coilform surrounding said spinner assembly and substantially thermally isolated therefrom,
a thermally conductive first rf sample coil supported on said ceramic coilform,
a thermally conductive second-stage cold plate inside said vacuum zone,
said vacuum zone further characterized as containing a plurality of additional high voltage rf reactive elements in addition to said sample coil, at least one of said additional reactive elements providing thermal contact between said sample coil and said second-stage cold plate,
a tuning zone near room temperature and separated from said vacuum zone by a gas-sealing barrier,
rf feed-through elements through said gas-sealing barrier,
a cooled radiation shield,
said vacuum zone further characterized as enclosing warm metallic components having emissivity less than 0.2,
first-stage cooling means for cooling said radiation shield to a temperature below 150 K,
second-stage cooling means for cooling said cold plate to a temperature below 40 K.

2. The probe of 1 in which said spinner assembly is further characterized as being capable of achieving stable sample spinning over the range of sample temperatures from 250 K to 450 K.

3. The probe of 1 in which said spinner assembly is further characterized as including drive nozzles near the upper end and an inward-flow Bernoulli bearing near the lower end.

4. The probe of 1 in which the said spinner assembly has total external non-metallic surface area less than 20 sq. cm.

5. The probe of 1 further characterized as including a bundle of optical fibers placed in said spinner assembly for spin rate detection.

6. The probe of 1 in which at least one of said reactive elements is a ceramic disc capacitor capable of handling rf voltages greater than 2 kV in vacuum, said capacitor comprised of metallic electrodes bonded to a dielectric of thermal conductivity greater than 15 W/m-K at 30 K.

7. The probe of 1 further characterized in that said gas lines and said exhaust tubes have emissivity less than 0.05 and magnetic susceptibility less than 5E-5 SI volumetric units.

8. The probe of 1 further characterized as including an evacuated tube for housing an upstream helium/copper heat exchanger for conductive cooling of said cold plate and a downstream helium/copper heat exchanger for conductive cooling of said radiation shield.

9. The probe of 1 in which the external boundary of said vacuum zone is substantially a polished pure metal near room temperature and has emissivity less than 0.05.

10. The probe of 1 in which means are provided for minor adjustments in the orientation angle of the axis of said spinner assembly and such means substantially have emissivity less than 0.05.

11. The probe of 1 in which said ceramic stator tubes are of silicon nitride.

12. The probe of 1 in which said spinner assembly is further characterized as being capable of achieving stable sample spinning over a range of exhaust pressures.

13. A method of making an NMR measurement on a solid sample near room temperature using a CryoMAS probe comprising the steps of:
inserting a rotor with a sample into a spinner assembly in the CryoMAS probe inside an NMR magnet, wherein said spinner assembly is further characterized as including hermetic ceramic-to-metal seals,
spinning the sample at the magic angle using pressurized gas near room temperature,
using a cryocooler to cool some of the coils and capacitors in tuned circuits in the probe to below 40 K,
maintaining a high vacuum in the region of the cooled coils and capacitors,
applying a sequence of rf excitation pulses to the tuned circuits, and
acquiring and processing the NMR RF signals from the tuned circuits following the excitation pulses.

14. The method of 13 further comprising measuring the spinning rate of the rotor by means of an optical fiber placed into the spinner assembly.

15. The method of claim 13 further comprising the step, performed after the acquisition step, of pneumatically ejecting the rotor from the spinner assembly.

* * * * *